United States Patent [19]

Huang

[11] Patent Number: 5,763,983
[45] Date of Patent: Jun. 9, 1998

[54] SINGLE CRYSTAL PIEZOELECTRIC TRANSFORMER USING EXTENSIONAL VIBRATION MODES AND METHOD FOR DRIVING THE SAME

[75] Inventor: Jin Huang, Hoffman Estates, Ill.

[73] Assignee: Motorola Inc., Schaumburg, Ill.

[21] Appl. No.: 784,565

[22] Filed: Jan. 12, 1997

[51] Int. Cl.$^6$ .................................................. H01L 41/08
[52] U.S. Cl. ........................... 310/360; 310/358; 310/366
[58] Field of Search ............................. 310/357–361, 310/366

[56] References Cited

U.S. PATENT DOCUMENTS

| | | | |
|---|---|---|---|
| 2,830,274 | 4/1958 | Rosen et al. | 310/359 |
| 4,046,456 | 9/1977 | Bonne | 310/357 X |
| 5,229,680 | 7/1993 | Sato et al. | 310/359 |
| 5,265,267 | 11/1993 | Martin et al. | 310/359 |
| 5,329,200 | 7/1994 | Zaitsu | 310/317 |
| 5,341,061 | 8/1994 | Zaitsu | 310/319 |
| 5,365,141 | 11/1994 | Kawai et al. | 310/359 |
| 5,371,430 | 12/1994 | Sato et al. | 310/359 |
| 5,402,031 | 3/1995 | Tagami et al. | 310/359 |
| 5,424,602 | 6/1995 | Sato et al. | 310/359 |
| 5,463,266 | 10/1995 | Fukuoka et al. | 310/359 |

FOREIGN PATENT DOCUMENTS 6132580A   5/1994   Japan .................................. 310/359

OTHER PUBLICATIONS

Piezoelectric Transformers using sinle crystals of Li NbO$_3$, by K. Nakamura & Y. Adachi, JASA Mar. 28, 1990, pp. 687, 688 (English language translation included).

*Primary Examiner*—Mark O. Budd
*Attorney, Agent, or Firm*—Brian M. Mancini

[57] ABSTRACT

A piezoelectric transformer (10) consisting of a single-crystal elongated plate (12) with electrodes (20, 26). A pair of driving sections (22) are formed on two opposite end regions of the plate (12). A receiving section (24) is formed on a central region of the plate (12). The plate (12) is operated in an even harmonic vibrational mode with the driving sections (22) operating in a transverse extensional mode and the receiving section (24) operating in a length extensional mode. Driving signals (46, 48) applied to the driving sections (22) are at the resonant frequency of the plate (12). The gain of the transformer (10) is adjustable by shifting the relative phase of the driving signals (46, 48) applied to the respective driving sections (22).

11 Claims, 6 Drawing Sheets

10

SINGLE CRYSTAL PIEZOELECTRIC TRANSFORMER USING EXTENSIONAL VIBRATION MODES AND METHOD FOR DRIVING THE SAME

FIELD OF THE INVENTION

The invention relates generally to the field of high voltage piezoelectric transformers, and in particular, to a single crystal piezoelectric transformer using extensional vibration modes and method for driving the same.

BACKGROUND OF THE INVENTION

Prior art high voltage piezoelectric transformers are based on the well known Rosen design (U.S. Pat. No. 2,830,274). These prior art high voltage transformer designs are of a piezoelectric ceramic plate which includes a driving section and a driven section which each have different polarizations. The different polarizations provide for the voltage transformation in these designs. However, these designs have several drawbacks. First, the piezoelectric plate must undergo special pre-processing in order to provide separately polarized sections. Second, the piezoelectric plate must be mounted at only one or two points to prevent damping. However, this makes the transformer device fragile. Third, an output electrical lead is attached to the plate at a location where mechanical displacement is at a maximum. This reduces transformer efficiency because the lead acts to damp the vibrations of the plate at this point. Also, the output lead undergoes vibrational fatigue and may break easily, shortening the lifetime of the device.

Generally, prior art piezoelectric transformers have been made with piezoelectric ceramic materials. In high voltage and power applications, piezoelectric ceramic materials heat up dramatically due to the hysteresis property of the ceramic. Heat is detrimental to the operation of the transformer, in that, heat causes the ceramic material to gradually depolarize which destroys the usefulness of the transformer.

In addition, it has proven difficult to provide piezoelectric transformers with adjustable gain. Prior methods for providing adjustable gain include pulse frequency modulation and pulse width modulation. Pulse frequency modulation provides adjustable gain as a function of driving the transformer at frequencies that are off resonance. The further off resonance the transformer becomes the less gain it has. The off resonance condition has the disadvantage of operating the transformer at less than optimum efficiencies and adds complexity to the accompanying driving circuits which are required to operated on either an inductive or capacitive side of resonance. Pulse width modulation provides adjustable gain as a function of the duty cycle of the driving signal. Changing the duty cycle of the driving signal has the disadvantage of diverting power to harmonic frequencies which reduces efficiency, also.

The need exists for a new piezoelectric transformer which: does not require special pre-processing to define polarization, does not require a plurality of differently polarized sections, is not driven at off-resonant or harmonic frequencies to provide adjustable gain, does not require electrical leads mounted at maximum displacement points on the piezoelectric plate, has efficient electromechanical coupling, and can be manufactured at a low cost.

DETAILED DESCRIPTION OF THE PREFERRED EMBODIMENT

All of the embodiments of the present invention described below utilize a single crystal piezoelectric body. In the present invention, a single crystal of lithium niobate of a crystallographic Y-cut, rotated about 131 degrees about the X axis from the Y axis, was preferred in the manufacture of the invention. However, other singly polarized bodies can be used in the present invention. Lithium niobate has a stable uniform natural polarization in the Z-axis direction. Therefore, heat will not cause gradual depolarization as can occur in prior art ceramic transformers (unless of course the Curie temperature of the lithium niobate is exceeded which changes the crystallographic structure). The polarization of the preferred lithium niobate cut can be described as having a direction that is rotated about 41° from a perpendicular direction of a major face of the body towards a length direction of the body. This particular cut has the advantage of providing optimum electromechanical coupling. In addition, lithium niobate has a much higher Q than prior art ceramic transformers. This is an advantage in that voltage transformation ratio is proportional to Q. For the present invention, the electrodes, electrical connections and mounting supports are provided by manufacturing techniques that are well known in the art and will not be repeated here.

Figure 1:
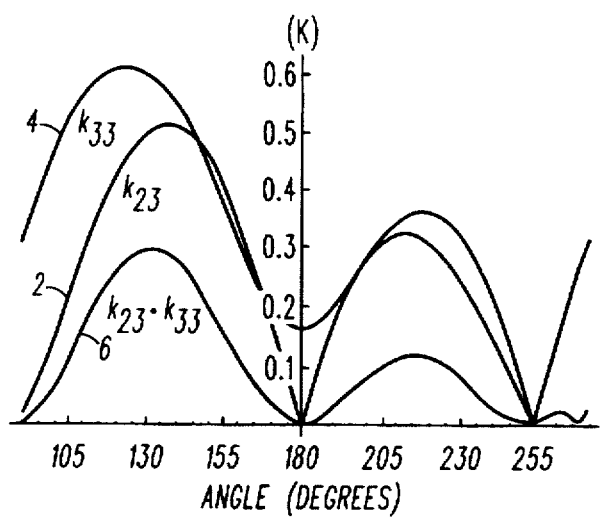
FIG. 1 is a graphical representation of electromechanical and piezoelectric coupling coefficients of Y-cut lithium niobate over various rotation angles, in accordance with the present invention.

FIG. 1 shows plots of a transverse extensional mode electromechanical coupling coefficient 2 ($k_{23}$), a length extensional mode electromechanical coupling coefficient 4 ($k_{33}$), and a product 6, $k_{23} \cdot k_{33}$, of the two coefficients versus angle for Y-cut lithium niobate.

In the present invention, a voltage applied to an input electrode (primary side) of the transformer generates an extensional acoustic wave in a length direction of the transformer substrate due to the transverse piezoelectric effect, whose strength can be described by the transverse electromechanical coupling coefficient 2, $k_{23}$. Similarly, due to the reverse piezoelectric effect of the extensional mode, whose strength can be described by the length extensional electromechanical coupling coefficient 4, $k_{33}$, the extensional acoustic wave in turn generates a voltage in an output electrode. Maximizing both coupling coefficients, $k_{23}$ and $k_{33}$, is critical for the best performance of the transformer. However, the maximum values of $k_{23}$ and $k_{33}$ do not occur in the same crystallographic direction.

As can be seen in FIG. 1, maximum extensional mode coupling 2, $k_{23}$, occurs at an angle cut of about 123° while a maximum length extensional mode electromechanical coupling coefficient 4, $k_{33}$, occurs at about 137°. The present invention will work appropriately within the range of 123° to 137°. However, the preferred cut in the present invention provides the best combined effects of $k_{23}$ and $k_{33}$. The product 6 of $k_{23}$ and $k_{33}$ demonstrates that the angle of optimum performance between $k_{23}$ and $k_{33}$ occurs at about 131°.

Figure 2:
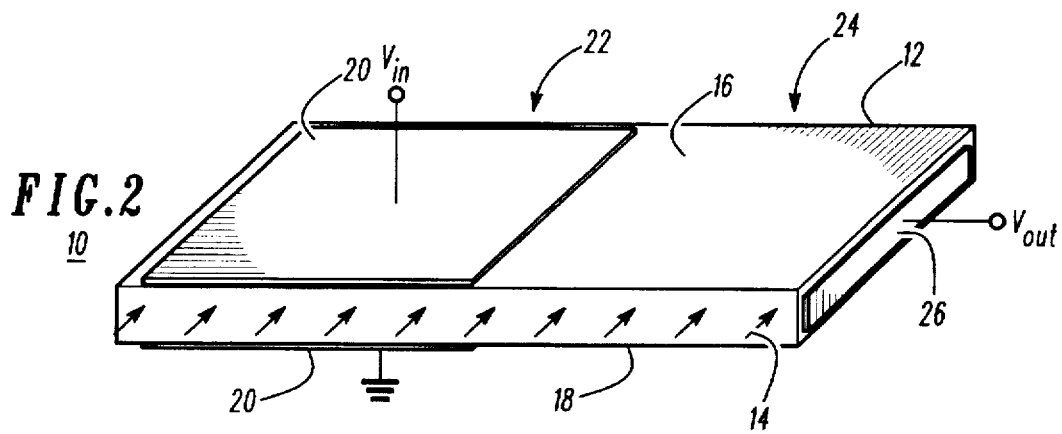
FIG. 2 is a perspective view of a first embodiment of a piezoelectric transformer, in accordance with the present invention.

FIG. 2 shows a perspective view of a first embodiment of the present invention. A piezoelectric transformer 10 is shown having a piezoelectric body which is single crystal having a polarization 14 in the direction shown. The piezoelectric body is in the form of an elongated plate 12 having an upper surface 16 and a lower surface 18. The plate 12 vibrates in an extensional mode of piezoelectric oscillation in a length direction of the plate 12. The plate 12 has at least one substantially opposing driving electrode pair 20 disposed on the upper and lower surfaces 16,18 of the plate 12 and defining at least one respective driving region 22. In addition, the plate 12 has at least one substantially non-electroded region defining a receiving region 24 which is terminated by at least one receiving electrode 26 disposed on a surface of the plate 12. Preferable, the receiving electrode 26 is disposed on an end of the plate 12 in a narrow strip.

Figure 3:
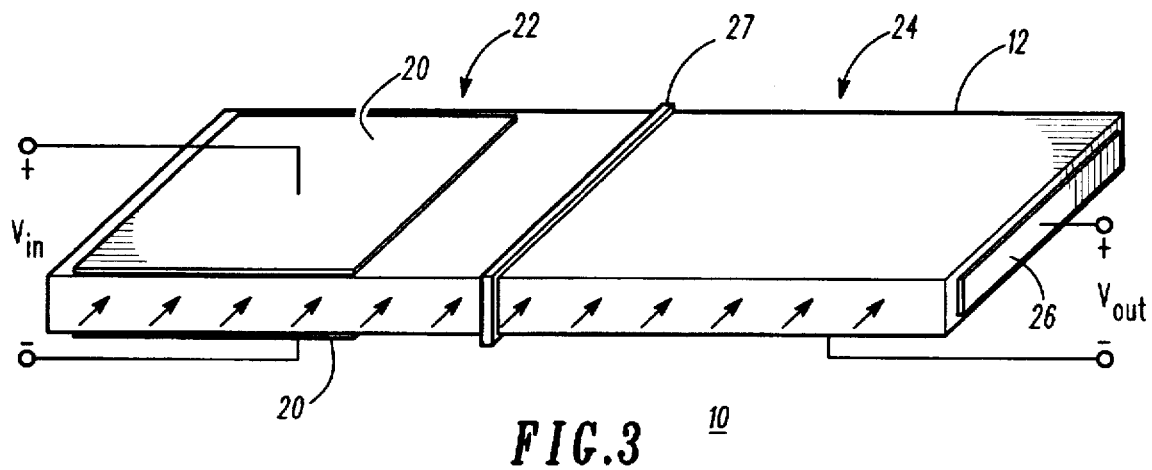
FIG. 3 is a side view of an alternative embodiment of the transformer of FIG. 2 having isolated input and output electrodes, in accordance with the present invention.

FIG. 3 shows an alternative embodiment of the transformer 10 of FIG. 2 having isolated driving electrodes 20 and receiving electrode 26. In this embodiment, an isolation electrode 27 in the form of a narrow strip is plated in a band around the plate 12 in proximity to the driving region 22. The receiving electrode 26 and the isolation electrode 27 provide electrical taps for the electrical field in the receiving region 24 of the plate 12 extending in a length direction from the driving electrodes 20 to the receiving electrode 26. This embodiment advantageously provides an electrical output of the transformer 10 which does not share an electrical connection with an input of the transformer 10.

Figure 4:
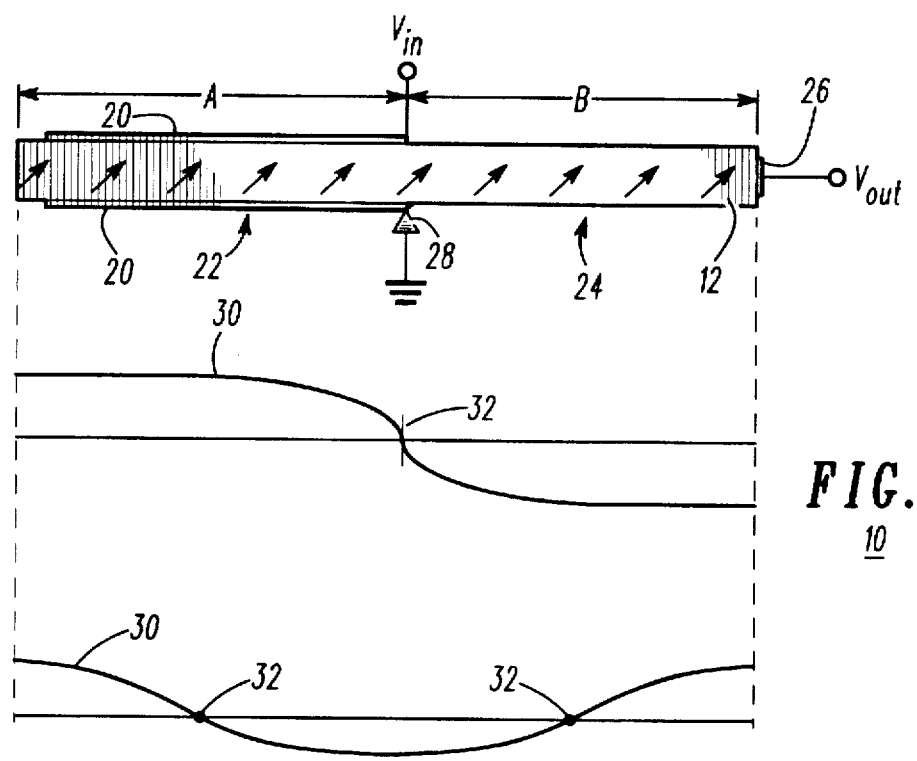
FIG. 4 is a side view of the transformer of FIG. 2 with a mounting support and electrical connections, a graphical representation of a longitudinal displacement along a length of the transformer for a fundamental resonance mode in which the transformer length is one-half wavelength ($\lambda/2$), and a graphical representation of a longitudinal displacement along a length of the transformer for a second harmonic resonance mode in which the transformer length is one wavelength ($1\lambda$), in accordance with the present invention.

FIG. 4 shows a side view of the transformer 10 of FIG. 2 with a mounting support 28 and electrical connections, $V_{in}$ and $V_{out}$, as shown. In addition, FIG. 4 shows a graphical representation of a magnitude of $\lambda/2$ longitudinal displacement 30 along the length of the piezoelectric plate 12, and a graphical representation of a magnitude of $1\lambda$ longitudinal displacement 30 along the length of the piezoelectric plate 12. The node(s) 32 and potential mounting support(s) 28 will be located at substantially one quarter wavelength in from either end of the plate 12. This is true for operation at any harmonic mode, but FIG. 2 shows mounting supports for only the $\lambda/2$ vibrational mode. It should be recognized that the performance of the transformer 10 is optimized when the mounting support 28 is located at a node 32 of minimum displacement 30 so as to minimize any damping of the piezoelectric vibrations of the plate 12. If possible, it is also desirable to locate the electrical connections, $V_{in}$ and $V_{out}$, at a node 32 of minimum displacement 30 as the leads or wirebonds of the electrical connection contribute to damping of the piezoelectric plate 12. In this case, it is beneficial to utilize the mounting support 28 as an electrical connection. However, an electrical connection to the receiving electrode is at a point of maximum displacement, and should therefore be of a very flexible nature to minimize any damping of vibration. In this embodiment, the electrical connection to $V_{out}$ is of a fine conductive wire coiled around an elastic filament. However, any type of fine wire configuration can be utilized with good results.

The transformer 10 has the receiving region 24 located near an end of the plate 12 with the receiving electrode 26 disposed at an end of the plate 12. A driving electrode pair 20 defining a driving region 22 is located near another end of the plate 12. It is not necessary that the driving region 22 or receiving region 24 be of exactly one-quarter or one-half wavelength. The node 32 is not necessarily in the middle point of the substrate. In addition, the driving electrode has an optimum size which is not necessarily half of the substrate length. The presence of the driving electrodes 20 and the different directions of the electric fields in the driving region 22 and receiving region 24, give rise to different acoustic wavelengths in the two regions such that the node 32 actually lies off center of the plate 12. To correct for this, the driving region 22 may be adjusted to be more or less than one-quarter or one-half wavelength in length and the mounting support 28 shifted accordingly to optimize efficiency and turns-ratio. Modeling and experiments have shown that the location of the node 32 may be off as much as 20% of the length of the substrate from the center point of the substrate for different load conditions. Also, for a given length and width of the substrate, the sizes of the driving electrodes 20 and receiving region 24 are adjustable to meet transformer specifications such as input/output impedance, voltage step-up/down ratio, efficiency, etc.

The graphical representations of FIG. 4 shows an odd and an even harmonic operating mode with displacements 30 having a substantially one-half or one full resonance wavelength, respectively. The transformer 10, when operated on a second harmonic as shown in the bottom graphical representation, provides two nodes 32 which could be used for two mounting supports 28 and electrical connections. The use of additional supports has the advantage of providing a much more robust and mechanically stable device.

Figure 5:
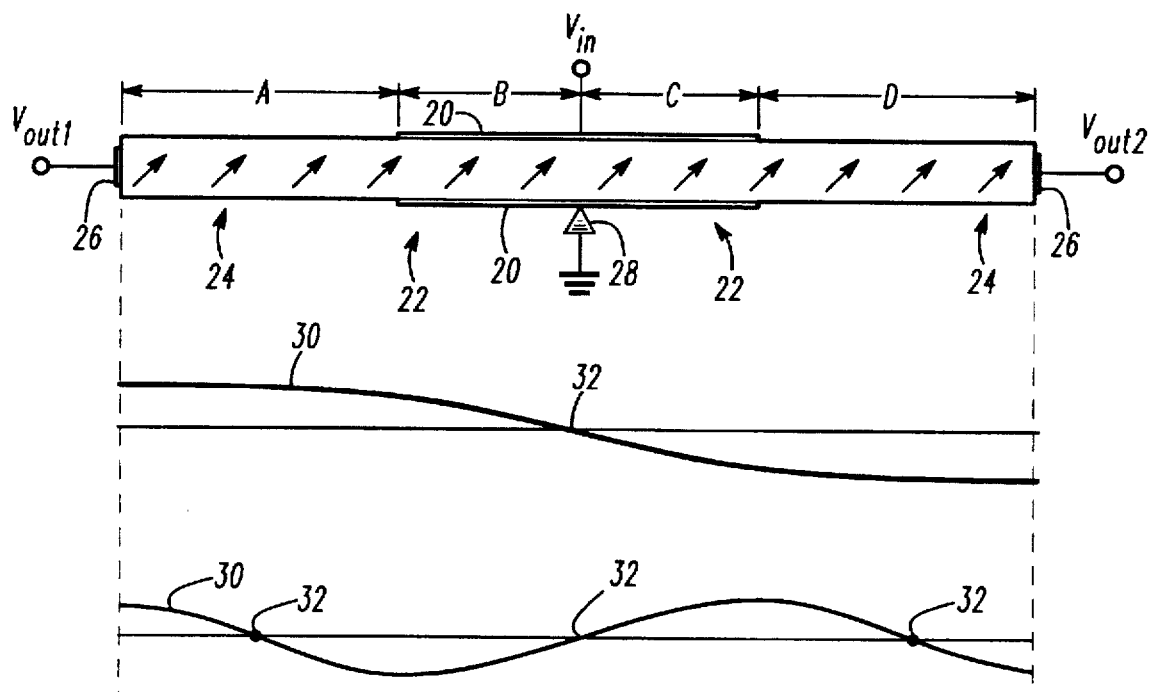
FIG. 5 is a side view of a second embodiment of a piezoelectric transformer, a graphical representation of a longitudinal displacement along a length of the transformer for a fundamental resonance mode in which the transformer length is one-half wavelength ($\lambda/2$), and a graphical representation of a longitudinal displacement along a length of the transformer for a third harmonic resonance mode in which the transformer length is $3\lambda/2$, in accordance with the present invention.

FIG. 5 shows a side view of a second embodiment of the present invention showing a piezoelectric transformer wherein at least one receiving region 24 is located near an end of the plate 12 and driving electrodes 20 defining at least one driving region 22 are disposed substantially at a central portion of the plate 12. In effect, this is an integral device which embodies two of the transformers 10 of FIG. 2 with their driving regions 22 joined. In this case, the driving regions 22 are located in a central portion of the plate 12, and at least one receiving electrode 26 is disposed at each end of the plate 12. The embodiment shown operates on a odd, $\lambda/2$ or $3\lambda/2$ vibrational mode.

For the $3\lambda/2$ mode, the sizes B and C total about $\lambda/2$ in length, but as above, it is not necessary that the driving regions 22 or receiving region 24 be of exactly one-half wavelength. Also, the size, A, of one receiving region 24 need not be the same as the size, D, of the other receiving region 24. When the sizing of the driving regions 22 and receiving regions 24 are symmetrical, it is known that a node 32 will be substantially at a center of the plate 12 and the magnitude $V_{out1}$ will equal the magnitude of $V_{out2}$ for the same load impedance. However, the sizes, B and C, of the driving regions 22 may be adjusted so as to optimize transformer specifications such as input/output impedance ratio, voltage step-up/down ratio, efficiency, etc. Moreover, this embodiment has the advantage of allowing two different sizes, A and D, for the receiving regions 24, such that two separate outputs, $V_{out1}$ and $V_{out2}$, are obtained. This provides for a multi-tapped transformer output where two voltage outputs are obtained. However, it should be recognized that providing an asymmetrical transformer configuration will require that the mounting support 28 be moved off-center to a location of a translated resonance node 32. In either mode, the sizes of A, B, C and D can all be optimized to meet design specifications.

Figure 6:
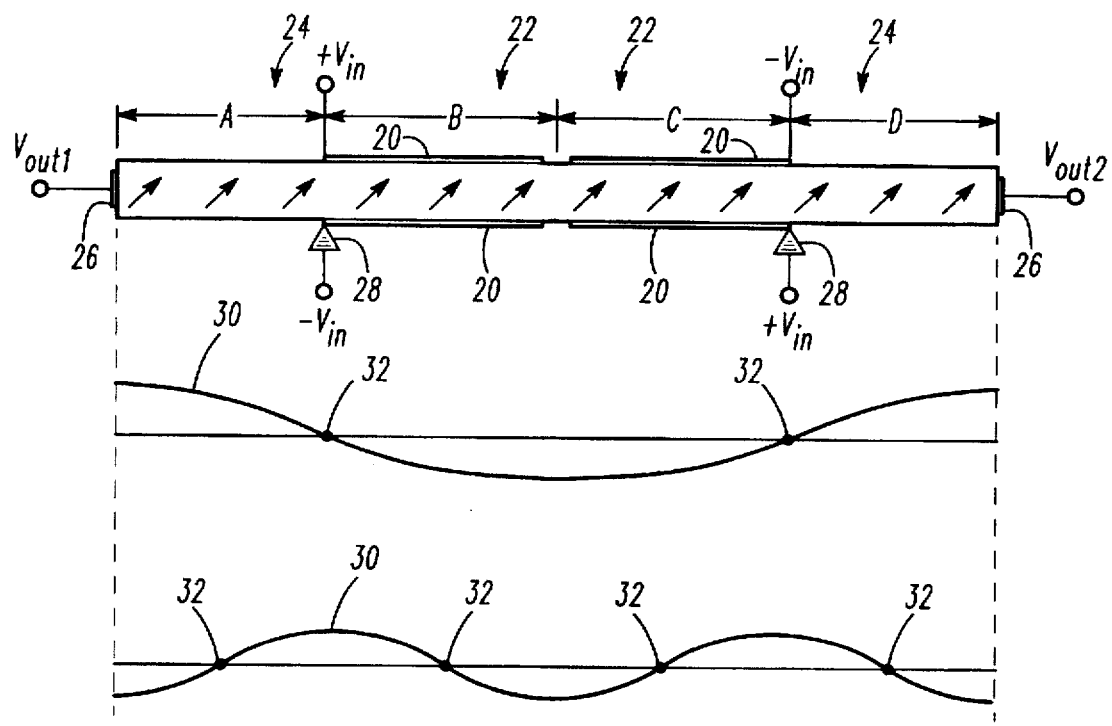
FIG. 6 is a side view of a third embodiment of a piezoelectric transformer, a graphical representation of a longitudinal displacement along a length of the transformer of $1\lambda$, and a graphical representation of a longitudinal displacement along a length of the transformer of $2\lambda$, in accordance with the present invention.

FIG. 6 shows a side view of a third embodiment of the present invention similar to the second embodiment of FIG. 5, but operating on an even, $1\lambda$ or $2\lambda$, vibrational mode as shown in the two respective graphical representations. In this third embodiment, two receiving regions 24 are located near an end of the plate 12 and driving electrodes 20 defining two driving regions 22 are disposed adjacent to a central portion of the plate 12. In effect, this is an integral device which embodies two of the transformers 10 of FIG. 1 with their driving regions 22 located adjacent to each other but not electrically connected. At least one receiving electrode 26 is disposed at each end of the plate 12.

As above, it is not necessary that each of the driving regions 22 or receiving regions 24 be of exactly one-half wavelength, either individually or in combination. Also, the size, A, of one receiving region 24 need not be the same as the size, D, of the other receiving region 24. When the sizing of the driving regions 22 and receiving regions 24 are symmetrical, it is known that the nodes 32 and potential mounting supports 28 will be located at substantially one quarter wavelength in from each end of the plate 12 and every half wavelength thereafter. This is true for operation at any even harmonic mode, but FIG. 6 shows mounting supports for only the $1\lambda$ vibrational mode.

The sizes, B and C, of the driving regions 22 may be adjusted so as to optimize transformer specifications such as input/output impedance ratio, voltage step-up/down ratio, efficiency, etc. Moreover, this embodiment has the advantage of allowing two different sizes, A and D, for the receiving regions 24, such that two separate outputs, $V_{out1}$ and $V_{out2}$, are obtained. This provides for a multi-tapped transformer output where two voltage outputs are obtained. It should be recognized that to provide an even mode of vibration it is necessary that the two driving regions 22 be driven about 180° out of phase from each other. Moreover, this embodiment may be driven at higher order even harmonic modes of vibration.

Figure 7:
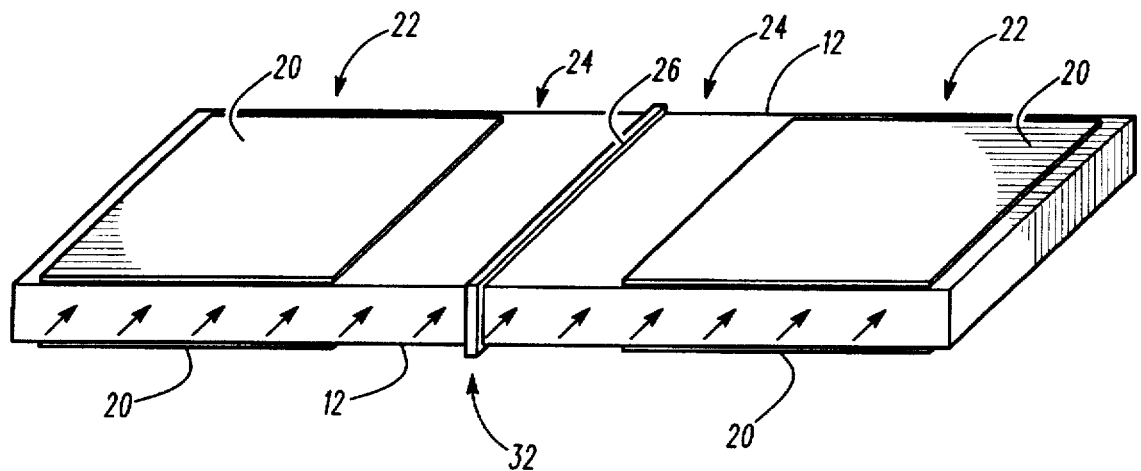
FIG. 7 is a perspective view of a fourth embodiment of a piezoelectric transformer, in accordance with the present invention.

FIG. 7 shows a perspective view of a fourth embodiment of the present invention showing a piezoelectric transformer wherein driving electrodes 20 defining at least one driving region 22 are located near an end of the plate 12 and a receiving electrode 26 is disposed substantially at a center of the plate 12. In effect, this is an integral device which embodies two of the transformers 10 of FIG. 2 with their receiving regions 24 joined. In this case, the receiving electrode 26 is disposed as a narrow band around a central surface portion of the plate 12.

Figure 8:
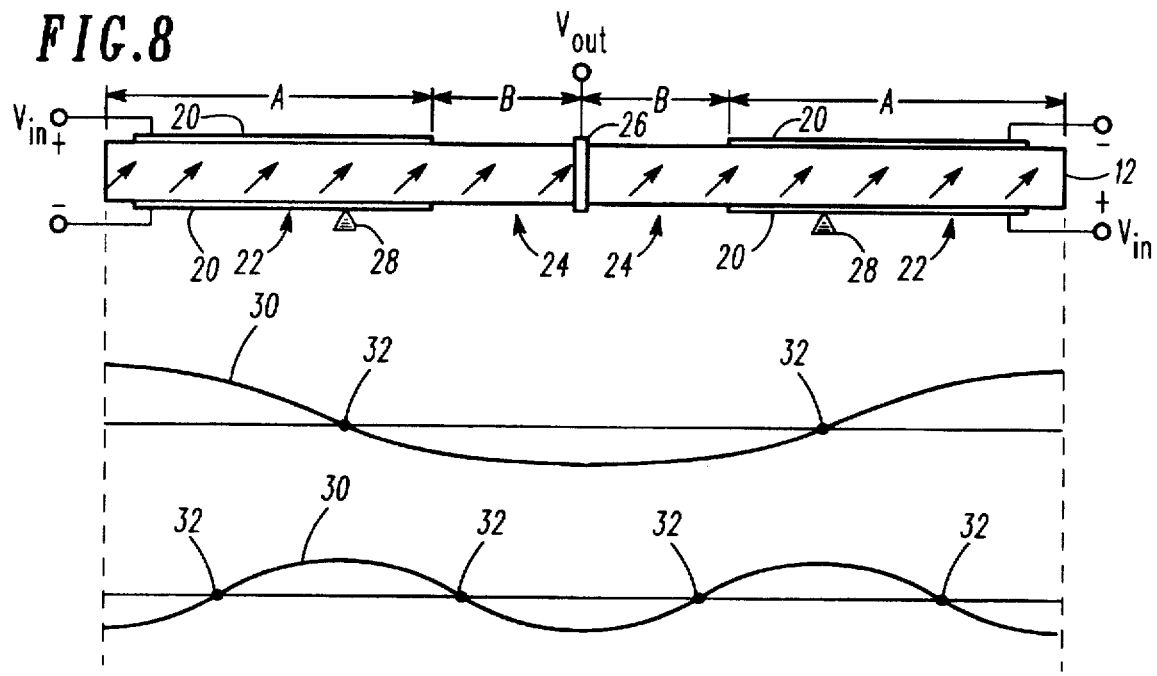
FIG. 8 is a side view of the transformer of FIG. 7 with a mounting support and electrical connections, a graphical representation of a longitudinal displacement along a length of the transformer of $1\lambda$, and a graphical representation of a longitudinal displacement along a length of the transformer of $2\lambda$, in accordance with the present invention.

FIG. 8 shows a side view of the transformer of FIG. 7 with two mounting supports 28 and electrical connections, $V_{in}$ and $V_{out}$, as shown. In addition, FIG. 8 shows graphical representations of a magnitude of one and two wavelengths of longitudinal displacement 30 along the length of the piezoelectric plate 12, respectively. As above, it is not necessary that each of the driving regions 22 or receiving region 24 be of exactly one-half wavelength, either in combination or individually. Also, the size, A, of the driving regions 22 and the size, B, of the receiving regions 24 may be adjusted so as to optimize transformer specifications such as input/output impedance ratio, voltage step-up/down ratio, efficiency, etc. However, when the sizing of the driving regions 22 and receiving region 24 are symmetrical, it is known that the nodes 32 will be substantially one quarter wavelength in from each end of the plate 12 and every half wavelength thereafter. This is true for operation at any even harmonic mode, but FIG. 8 shows mounting supports 28 for only the $1\lambda$ vibrational mode. In the fundamental operating mode ($1\lambda$), it is necessary that the size, A, of the driving regions 22 be less than $\lambda/2$ to prevent shorting to the receiving electrode 26. However, on the second harmonic ($2\lambda$), the driving regions 22 can be made larger than $\lambda/2$ to suit the application.

Figure 9:
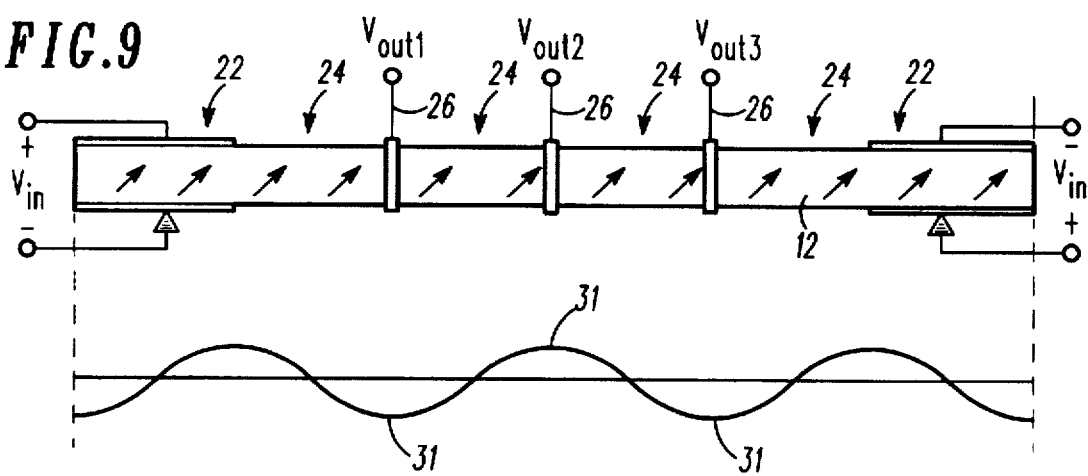
FIG. 9 is a side view of an overtone configuration of the embodiment of FIG. 8 with a graphical representation of a longitudinal displacement along a length of the transformer of $3\lambda$, in accordance with the present invention.

FIG. 9 shows another embodiment of the transformer of FIGS. 7 and 8 having higher, even-mode harmonics. The embodiment shown is $3\lambda$, but higher integral wavelengths can be achieved. Advantageously, this embodiment provides multiple output taps (receiving electrodes 26), $V_{out2}$, $V_{out2}$ and $V_{out3}$. The taps are located at extensional displacement extremes 31 (maximum and minimum) to provide highest output. This embodiment can be expanded to contain any number of alternate-phase output taps disposed at one-half wavelengths along a length of the transformer plate 12.

Figure 10:
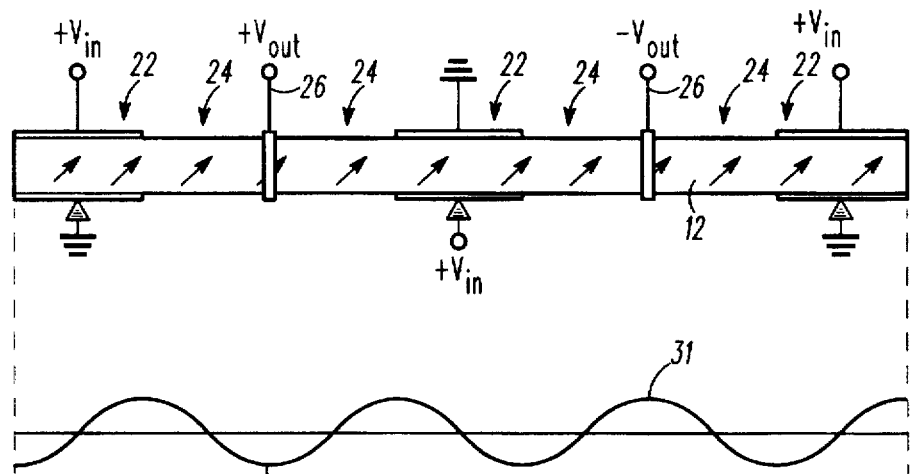
FIG. 10 is a side view of an alternative embodiment of the transformer of FIG. 9 with a graphical representation of a longitudinal displacement along a length of the transformer of $7\lambda/2$, in accordance with the present invention.

FIG. 10 shows an alternative embodiment of the transformer of FIG. 9 having driving and receiving regions are located alternately along the length direction of the plate. This design operates on an odd-mode, and the driving and receiving regions are located $3\lambda/4$ apart, center-to-center. In the design shown, a driving region is located at one end of the plate alternately followed by receiving regions 24 and driving regions 22. The series of regions 22, 24 is shown terminating in a driving region 22. However, the design can also be terminated in a receiving electrode 26. In addition, the design can start and end with receiving electrodes 26 (not shown). It should be noted that every other driving region 22 is driven in-phase with interposed driving regions being driven out-of-phase.

Figure 11:
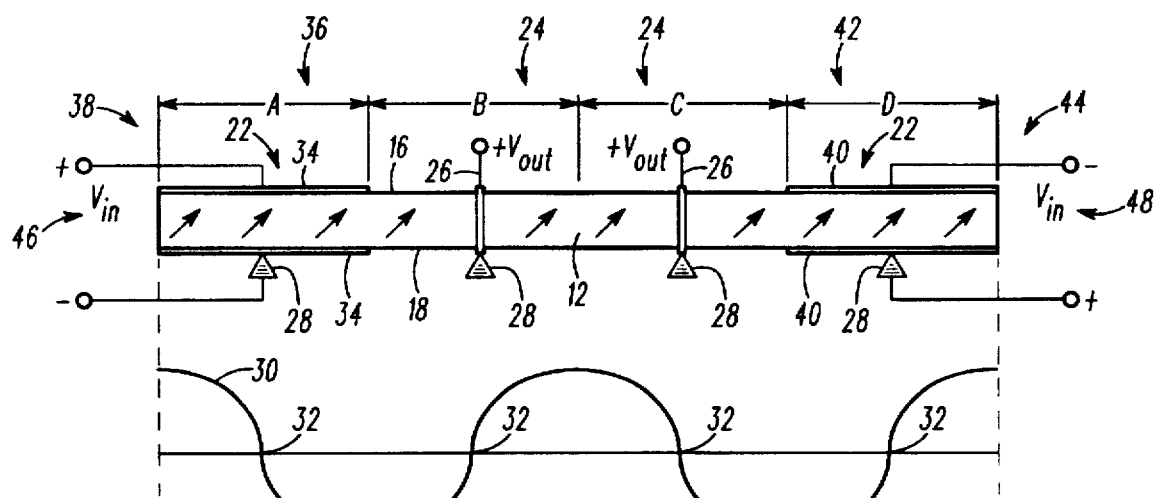
FIG. 11 is a side view of a preferred embodiment of a piezoelectric transformer with a graphical representation of a longitudinal displacement along a length of the transformer of $2\lambda$, in accordance with the present invention.

FIG. 11 shows a preferred embodiment of a piezoelectric transformer that is similar to the embodiment of FIGS. 7 and 8. The piezoelectric transformer includes driving electrodes 20 defining at least one driving region 22 located near an end of the plate 12 and at least one receiving electrode 26 is disposed substantially at a resonance node 32 of the plate 12. In this case, the receiving regions 24 are located in a central portion of the plate 12. Each of the receiving electrodes 26 are disposed as a narrow band around a central surface portion of the plate 12 at a resonance node 32. This embodiment utilizes an even mode of vibration and has the advantage of allowing all electrical connections and mounting supports 28 to be located at vibrational nodes 32, thereby minimizing vibrational damping from electrical connection leads. The transformer shown operates on a fourth harmonic. Each of the segments, A and B, are of about one-half wavelength, but may be of different lengths for the reasons stated earlier.

In particular, the piezoelectric transformer includes a singularly polarized piezoelectric body in the form of an elongated plate 12 having an upper surface 16 and a lower surface 18. The plate 12 has a piezoelectric oscillating mode having an even number of substantially one-half resonance wavelengths of an extensional mode oscillation in a length direction of the plate 12. The plate 12 has a first substantially opposing driving electrode pair 34 disposed on the upper and lower surfaces 16,18 of the plate 12 near a first end 38 of the plate 12 and defining a first driving region 36, and a second substantially opposing driving electrode pair 40 disposed on the upper and lower surfaces 16,18 of the plate 12 near a second end 44 of the plate 12 and defining a second driving region 42. The plate 12 has a substantially non-electroded region at a central portion of the plate 12 defining a receiving region 24 and being terminated by at least one receiving electrode 26 disposed on the plate 12 substantially at a resonance node 32 of the plate 12.

Figure 12:
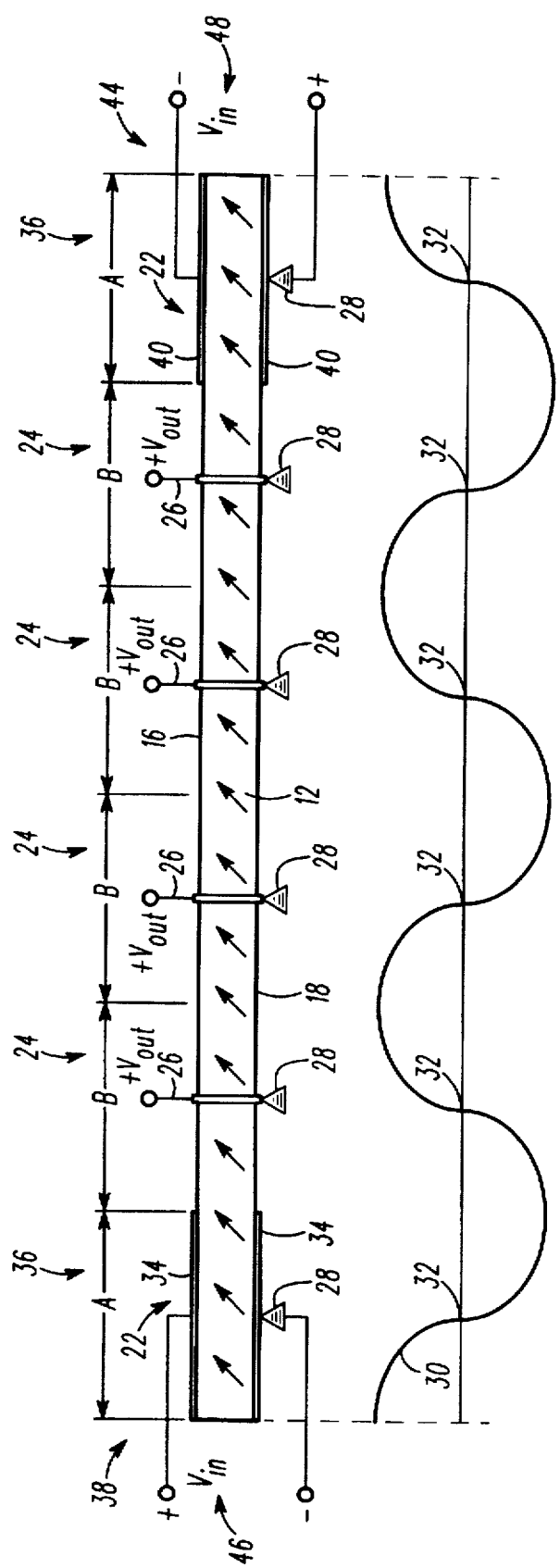
FIG. 12 is a side view of an overtone configuration of the embodiment of FIG. 11 with a graphical representation of a longitudinal displacement along a length of the transformer of $3\lambda$, in accordance with the present invention.

The preferred embodiment may be configured for any even number of substantially one-half resonance wavelengths. For example, FIG. 12 shows an sixth harmonic configuration of the transformer of the preferred embodiment of FIG. 8.

The transformers of FIGS. 6–12 are devices with at least dual inputs ($V_{in}$) which may be driven in a similar manner. Using FIG. 11 as an example, the present invention provides a method of driving a dual input transformer such that the driving regions 36,42 are driven substantially at a resonant frequency while providing adjustable gain at the at least one receiving electrode 26. This is done by adjusting the phase relationship between a first signal 46 applied to a first driving region 36 with respect to a second signal 48 applied to a second driving region 42. Generally, the AC voltage applied to the driving electrode pairs 34,40 across the driving regions 36,42 is of a square-wave form. This is done to improve the efficiency of switching circuitry (not shown) used to drive the piezoelectric transformer. Usually, the switching circuitry is the least efficient portion of the voltage transformer circuit. Therefore, the drive signals used are optimized for this weakest link. However, it should be recognized that a sinewave could also be used to drive the driven regions 36,42, in that, the use of a sinewave optimizes the efficiency of the piezoelectric portion of the entire circuit. This is particularly advantageous when a switching power supply is not being used to drive the transformer. In addition, one driving region of the transformer may be operated in a freely oscillating resonant mode, such as with an oscillator circuit, while the other driving region is driven with a phase shifted signal to adjust the gain at the receiving electrode 26.

Therefore, the present invention includes a method for driving the dual input transformers of FIGS. 6–12, comprising the steps of: driving the first driving region with a first signal at about a resonant frequency of the plate, and driving the second driving region with a second signal at about a resonant frequency of the plate, but with the second signal having an adjustable phase relationship relative to the first signal such that an output signal obtained from the at least one receiving electrode demonstrates a correspondingly adjustable gain.

For example, driving the first driving region about 180° out-of-phase from the second driving region produces a maximum gain at the receiving electrode. Driving both driving regions in-phase produces a minimum gain at the receiving electrode. Driving the first driving region about 90° out-of-phase from the second driving region produces about $1/\sqrt{2}$ of the potential maximum gain at the receiving electrode.

Using a resonant frequency for driving both inputs has the advantage of always operating the piezoelectric transformer at its most efficient frequency. Driving the driving regions 180° out-of-phase produces the maximum gain and power transfer, as expected. Surprisingly however, when the two driving regions are operated in-phase the input impedance of the transformer rises correspondingly such that very little power is dissipated by the transformer as waste heat. Experimental tests have shown that driving the driving regions substantially in-phase reduces the gain at the receiving electrode by more than 20 db over the gain available at the receiving electrode when the driving regions are driven 180° out-of-phase.

Comparative Examples

A first design of the transformer of FIG. 2 used a piezoelectric plate of 135° Y-cut lithium niobate having dimensions of: 35 mm in length, 7 mm in width and 0.45 mm in thickness. The deposited driving electrode pair were 7 mm in width and 17.5 mm in length and deposited near a first end of the plate, as shown. A receiving electrode was deposited on a opposite end of the plate as shown. The plate was operated on a fundamental resonant frequency of 85748 Hz with the plate exhibiting a Q of about 10000. The transformer was terminated with a 1 Mohm resistive load and driven with a 5 V signal. The input impedance of the transformer was 257 ohms. An output voltage of about 305 V was obtained for a turns-ratio of 61. The efficiency of the measured transformer was 0.96. The same transformer was operated on a second harmonic at a frequency of 173070 Hz. For this case the input impedance of the transformer was 505 ohms. An output voltage of about 220 V was obtained for a turns-ratio of 44. The efficiency of the measured transformer was 0.99.

A second design of the transformer of FIG. 2 used a piezoelectric plate of 135° Y-cut lithium niobate having dimensions of: 35 mm in length, 7 mm in width and 0.45 mm in thickness. The deposited driving electrode pair were 7 mm in width and 20 mm in length and deposited near a first end of the plate, as shown. A receiving electrode was deposited on an opposite end of the plate as shown. The plate was operated on a fundamental resonant frequency of 83944 Hz with the plate exhibiting a Q of about 10000. The transformer was terminated with a 1 Mohm resistive load and driven with a 5 V signal. The input impedance of the transformer was 147 ohms. An output voltage of about 402

V was obtained for a turns-ratio of 80. The efficiency of the measured transformer was 0.95. In this case, it can be seen that this second design provides better turns ratio than the fundamental frequency operation of the first design. Surprisingly, this occurs for driving electrodes that are greater than a λ/2 section of the piezoelectric plate. This is an improvement in the art since prior art designs have relied on electrode sizes having a length of exactly λ/2. It should also be noted that the fundamental operating frequency of the plate has changed, which shifts the location of the node point. The exact location of the node point is important to provide a mounting support with the least damping effect on the vibrations of the plate.

A third design of the transformer of FIG. 2 used a piezoelectric plate of 135° Y-cut lithium niobate having dimensions of: 35 mm in length, 7 mm in width and 0.45 mm in thickness. The deposited driving electrode pair were 7 mm in width and 15 mm in length and deposited near a first end of the plate, as shown. A receiving electrode was deposited on an opposite end of the plate as shown. The plate was operated on a second harmonic frequency of 174116 Hz with the plate exhibiting a Q of about 10000. The transformer was terminated with a 1 Mohm resistive load and driven with a 5 V signal. The input impedance of the transformer was 371 ohms. An output voltage of about 255 V was obtained for a turns-ratio of 51. The efficiency of the measured transformer was 0.96. In this case, it can be seen that this second design provides better turns ratio than the second harmonic frequency operation of the first design. Surprisingly, this occurs for driving electrodes that are less than a λ/2 section of the piezoelectric plate. This is an improvement in the art since prior art designs have relied on electrode sizes having a length of exactly λ/2. It should also be noted that the second harmonic operating frequency of the plate has changed, which shifts the location of the node point. However, this shift is not as extreme as the case for the fundamental mode.

A fourth design of the transformer utilized the configuration of FIG. 11. In this design, a piezoelectric plate of 135° Y-cut lithium niobate was provided having dimensions of: 35 mm in length, 7 mm in width and 0.45 mm in thickness. The deposited driving electrode pair were 7 mm in width and 8.75 mm in length and deposited near a first end of the plate, as shown. A receiving electrode was deposited in a band around the plate located at node points as shown that are 13.125 mm in from each end of the plate. The plate was operated on a fourth harmonic frequency of 337 kHz. The fourth harmonic design has the advantage of having a shorter output section and doubled cross-section (two sides of the output electrode), therefore it provides a lower transformer internal output impedance while producing similar turns-ratio as the previous designs, but lower input impedance. An advantage of reducing the transformer internal output impedance is that better efficiency can be achieved for a given load. When the transformer was terminated with a 1 Mohm resistive load and driven with a 5 V signal, the input impedance of the transformer was 70 ohms. In this case, an output voltage of about 325 V was obtained for a turns-ratio of 65 and an efficiency of 0.30. Terminating the transformer with a load of 100 kohms produced an input impedance of 142 ohms and an output voltage of about 125 V for a turns-ratio of 25 and an efficiency of 0.89.

Piezoelectric transformer efficiency is maximized at particular load resistances. The efficiency drops for values of load resistance that are higher or lower than the optimum load. Therefore, a transformer having maximum efficiency at a lower load resistance can be used advantageously in applications requiring lower load resistances, such as DC—DC converters. This fourth embodiment provides this advantage in that maximum efficiency is provided at a lower load than the previous embodiments.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A piezoelectric transformer, comprising:

a single crystal piezoelectric body in the form of an elongated plate with an upper surface and a lower surface and having a uniform polarization that is directed at an angle to both a normal to the upper and lower surfaces and a length direction of the plate;

at least one substantially opposing driving electrode pair disposed on the upper and lower surfaces of the plate and defining at least one respective driving region, the driving electrodes are disposed substantially at a central portion of the plate;

at least two substantially non-electroded regions defining respective receiving regions terminated by two receiving electrodes disposed at each end of the plate; and at least one mounting support providing an electrical connection and positioned along the length of the piezoelectric body at a node of minimum vibrational displacement, positioning of the node being dependent on the transformer load condition;

the driving electrodes when driven by an electrical signal producing an electric field in a thickness direction of the plate within the driving region generating an extensional mode of piezoelectric oscillation in a length direction of the plate, the receiving regions when driven by the extension mode of vibration generating an electric field across the length direction of the plate and thus producing an output voltage at the receiving electrodes, the plate having an odd mode of vibration.

2. A piezoelectric transformer, comprising:

a single crystal piezoelectric body in the form of an elongated plate with an upper surface and a lower surface and having a uniform polarization that is directed at an angle to both a normal to the upper and lower surfaces and a length direction of the plate;

at least two substantially non-electroded region defining receiving regions, the two receiving regions are each located near an end of the plate with two receiving electrodes each disposed at the ends of the plate;

at least two pairs of substantially opposing driving electrodes which define two respective driving regions are disposed on the upper and lower surfaces of the plate adjacent to a central portion of the plate; and at least two mounting supports providing an electrical connection and positioned along the length of the piezoelectric body at nodes of minimum vibrational displacement, positioning of the nodes being dependent on the transformer load condition;

the driving electrodes when driven by an electrical signal producing an electric field in a thickness direction of the plate within the driving regions generating an extensional mode of piezoelectric oscillation in a length direction of the plate, the receiving regions when driven by the extension mode of vibration generating an electric field across the length direction of the plate and thus producing an output voltage at the receiving electrodes, the two driving regions when driven about 180° out-of-phase from each other providing an even mode of vibration in the plate.

3. A piezoelectric transformer, comprising:

a single crystal piezoelectric body in the form of an elongated plate with an upper surface and a lower surface and having a uniform polarization that is directed at an angle to both a normal to the upper and lower surfaces and a length direction of the plate;

at least two substantially non-electroded region defining receiving regions, the two receiving regions are each located adjacent to a central portion of the plate, the two receiving regions sharing one receiving electrode disposed at the central portion of the plate;

at least two pairs of substantially opposing driving electrodes which define two respective driving regions are disposed on the upper and lower surfaces of the plate near each end portion of the plate; and at least two mounting supports providing an electrical connection and positioned along the length of the piezoelectric body at nodes of minimum vibrational displacement, positioning of the nodes being dependent on the transformer load condition;

the driving electrodes when driven by an electrical signal producing an electric field in a thickness direction of the plate within the driving regions generating an extensional mode of piezoelectric oscillation in a length direction of the plate, the receiving regions when driven by the extension mode of vibration generating an electric field across the length direction of the plate and thus producing an output voltage at the receiving electrodes, the two driving regions when driven about 180° out-of-phase from each other providing an even mode of vibration in the plate.

4. A piezoelectric transformer, comprising:

a single crystal piezoelectric body in the form of an elongated plate with an upper surface and a lower surface and having a uniform polarization that is directed at an angle to both a normal to the upper and lower surfaces and a length direction of the plate;

at least two pairs of substantially opposing driving electrodes which define two respective driving regions are disposed on the upper and lower surfaces of the plate near each end portion of the plate;

a plurality of substantially non-electroded receiving regions are located between the two driving regions, a plurality of receiving electrodes are disposed at substantially one-half wavelengths along the length of the plate at maximum and minimum extensional displacement extremes to provide multiple alternate-phase output taps; and at least two mounting supports providing an electrical connection and positioned along the length of the piezoelectric body at nodes of minimum vibrational displacement, positioning of the nodes being dependent on the transformer load condition;

the driving electrodes when driven by an electrical signal producing an electric field in a thickness direction of the plate within the driving regions generating an extensional mode of piezoelectric oscillation in a length direction of the plate, the receiving regions when driven by the extension mode of vibration generating an electric field across the length direction of the plate and thus producing an output voltage at the receiving electrodes, the two driving regions when driven about 180° out-of-phase from each other providing an even mode of vibration in the plate.

5. A piezoelectric transformer, comprising:

a single crystal piezoelectric body in the form of an elongated plate with an upper surface and a lower surface and having a uniform polarization that is directed at an angle to both a normal to the upper and lower surfaces and a length direction of the plate:

a plurality of substantially opposing driving electrode pairs disposed on the upper and lower surfaces of the plate and defining respective driving regions:

a plurality of substantially non-electroded regions defining respective receiving regions each being terminated by at least one receiving electrode disposed on the plate substantially distant from the driving region:

the plurality of driving and receiving regions are located alternately along the length direction of the plate, the driving and receiving regions having a center-to-center distance of 3λ/4 acoustic wavelength therebetween; and at least three mounting supports providing electrical connections and positioned along the length of the piezoelectric body at nodes of minimum vibrational displacement, positioning of the nodes being dependent on the transformer load condition;

the driving electrodes when driven by an electrical signal producing an electric field in a thickness direction of the plate within the driving regions generating an extensional mode of piezoelectric oscillation in a length direction of the plate, the receiving regions when driven by the extension mode of vibration generating an electric field across the length direction of the plate and thus producing an output voltage at the receiving electrodes, the plate having an odd mode of vibration when every other driving region is driven in-phase and interposed driving regions are driven out-of-phase.

6. A piezoelectric transformer, comprising:

a singularly polarized piezoelectric body in the form of an elongated plate with an upper surface and a lower surface and having a polarization directed at an angle to both a normal to the upper and lower surfaces and a length direction of the plate;

the plate having an even number of substantially one-half acoustic wavelengths of an extensional mode of oscillation in the length direction of the plate;

a first substantially opposing driving electrode pair disposed on the upper and lower surfaces of the plate near a first end of the plate and defining a first driving region, the plate having a second substantially opposing driving electrode pair disposed on the upper and lower surfaces of the plate near a second end of the plate and defining a second driving region each driving region including a node of minimum vibrational displacement;

a substantially non-electroded region at a central portion of the plate defining a receiving region and being terminated by at least one receiving electrode disposed on the plate substantially at a node of minimum vibrational displacement; and at least three mounting supports each providing an individual electrical connection to the first and second substantially opposing driving electrode pairs and the at least one receiving electrode, all of the mounting supports positioned along the length of the piezoelectric body substantially at nodes of minimum vibrational displacement, positioning of the nodes being dependent on the transformer load conditions:

the driving electrodes when driven by an electrical signal producing an electric field in a thickness direction of the plate within the driving regions generating an extensional mode of piezoelectric oscillation in a length direction of the plate, the receiving region when driven by the extension mode of vibration generating an electric field across the length direction of the plate and thus producing an output voltage at the at least one receiving electrode.

7. The piezoelectric transformer of claim 6, wherein the substantially non-electroded region has a length of approximately one acoustic wavelength and includes two receiving electrodes, and the two driving regions when driven about 180° out-of-phase from each other provide an even mode of vibration in the plate.

8. The piezoelectric transformer of claim 6, wherein the substantially non-electroded region has a length of approximately two acoustic wavelengths and includes four receiving electrodes, and the two driving regions when driven about 180° out-of-phase from each other provide an even mode of vibration in the plate.

9. The piezoelectric transformer of claim 6, wherein the piezoelectric body is selected from a single crystal of lithium niobate having a crystallographic Y-cut of from about 123 degrees to about 137 degrees.

10. The piezoelectric transformer of claim 9, wherein the single crystal of lithium niobate is a crystallographic Y-cut of about 131 degrees.

11. The piezoelectric transformer of claim 6, further comprising an isolation electrode disposed in the receiving region in proximity to one driving region so as to provide an electrical output connection isolated from electrical input connections to the transformer.

* * * * *